United States Patent
Ooi et al.

(10) Patent No.: US 10,541,200 B2
(45) Date of Patent: Jan. 21, 2020

(54) OVER-MOLDED IC PACKAGES WITH EMBEDDED VOLTAGE REFERENCE PLANE AND HEATER SPREADER

(71) Applicant: Intel Corporation, Santa Clara, CA (US)

(72) Inventors: Ping Ping Ooi, Butterworth (MY); Bok Eng Cheah, Bayan Lepas (MY); Jackson Chung Peng Kong, Tanjung Tokong (MY); Mooi Ling Chang, Bayan Baru (MY); Wen Wei Lum, Sungai Petani (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/982,912

(22) Filed: May 17, 2018

(65) Prior Publication Data

US 2018/0366407 A1 Dec. 20, 2018

(30) Foreign Application Priority Data

Jun. 19, 2017 (MY) .......................... PI 2017702273

(51) Int. Cl.
*H01L 23/522* (2006.01)
*H01L 23/528* (2006.01)
*H01L 23/538* (2006.01)
*H01L 23/367* (2006.01)
*H01L 23/50* (2006.01)

(52) U.S. Cl.
CPC ........ *H01L 23/5226* (2013.01); *H01L 23/367* (2013.01); *H01L 23/50* (2013.01); *H01L 23/528* (2013.01); *H01L 23/5389* (2013.01)

(58) Field of Classification Search
CPC .............. H01L 23/5226; H01L 23/522; H01L 23/5228; H01L 23/3677; H01L 23/367; H01L 23/5389; H01L 23/538
See application file for complete search history.

(56) References Cited

U.S. PATENT DOCUMENTS

| 2010/0290191 A1* | 11/2010 | Lin | ................... | H01L 23/49816 |
| | | | | 361/704 |
| 2013/0127037 A1* | 5/2013 | Mori | ................... | H01L 23/3677 |
| | | | | 257/712 |

* cited by examiner

*Primary Examiner* — Thanhha S Pham
(74) *Attorney, Agent, or Firm* — Green, Howard, & Mughal LLP.

(57) ABSTRACT

Over-molded IC package assemblies including an embedded voltage reference plane and/or heat spreader. In some embodiments, an over-molded package assembly includes a IC chip or die coupled to one or more metal distribution layer or package substrate. A molding compound encapsulates at least the IC chip and one or more conductive layers are embedded within the molding compound. The conductive layers may include an interior portion located over the IC chip and a peripheral portion located over the redistribution layers or package substrate. The interior portion may comprise one or more heat conductive features, which may physically contact a surface of the IC chip. In some further embodiments, the peripheral portion comprises one or more electrically conductive features, which may physically contact a surface of the package redistribution layers or package substrate to convey a reference voltage. One or more conductive traces may connect the conductive features in the interior with conductive features in the periphery.

15 Claims, 9 Drawing Sheets

OVER-MOLDED IC PACKAGES WITH EMBEDDED VOLTAGE REFERENCE PLANE AND HEATER SPREADER

CLAIM OF PRIORITY

This Application claims priority to MY Patent Application No. PI 2017702273, filed on 19 Jun. 2017, and titled "OVER-MOLDED IC PACKAGES WITH EMBEDDED VOLTAGE REFERENCE PLANE & HEATER SPREADER", which is incorporated by reference in its entirety for all purposes.

BACKGROUND

There are many integrated circuits (IC) chip, or die, packaging technologies. Ultra-small form factor package assemblies seek to minimize package assembly thickness or "z-height". In some applications (e.g., mobile devices), the package assembly thickness is one of the most important parameters in response to the design trend toward thinner devices. However, reduced IC chip thicknesses desirable for ultra-small form factor applications are associated with increased thermal dissipation. Demand for ICs to be functioning at high temperature (e.g., 125 C or higher) is also making package assembly thermal management more challenging.

Conventional techniques to improve IC thermal dissipation for molded IC packages include exposed-die molding where the back surface of the IC chip (opposite the circuitry) is not enclosed by the mold compound. While this technique allows an IC chip to be somewhat thicker than it could otherwise, or allows for application of a thermal interface material (TIM) and attachment of an integrated heat spreader (IHS), such package assembly thicknesses can exceed 300 µm, making them unsuitable for ultra-small form factor applications.

BRIEF DESCRIPTION OF THE DRAWINGS

The subject matter described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
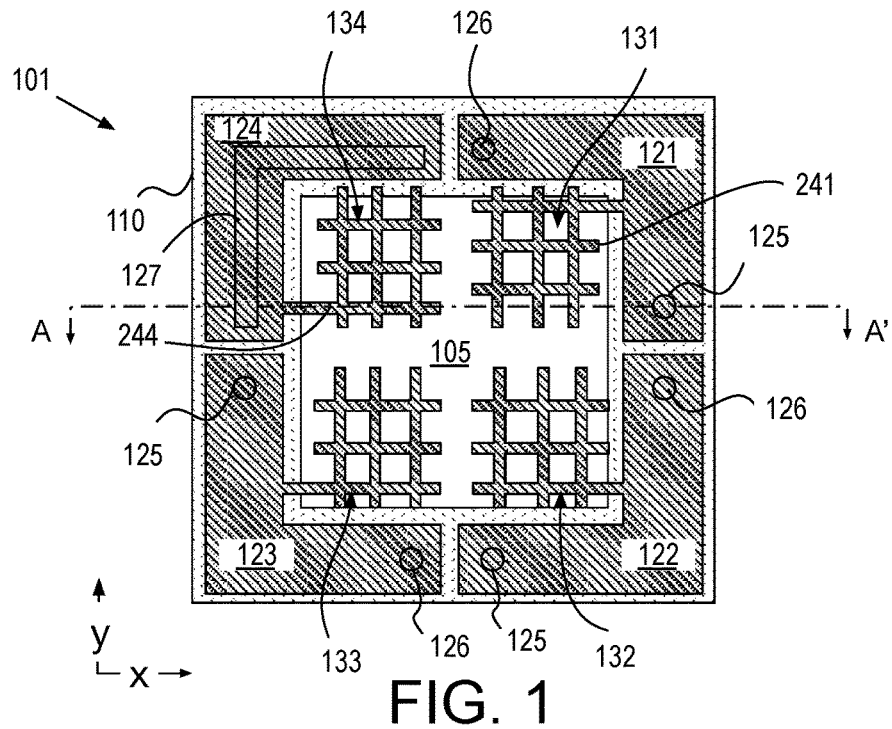
FIG. 1 is a top-down plan view of an IC in an over-molded package assembly, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or"

as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Over-molded IC package assemblies including an embedded voltage reference and/or embedded heat spreader are described below. Techniques to form such package structures are also described below. In some embodiments, an over-molded package assembly includes a IC chip or die coupled to one or more metal distribution layers, or a package substrate. A molding compound encapsulates at least the IC chip and one or more conductive layers are embedded within the molding compound. These conductive layers may include an interior portion located over IC chip and a peripheral portion located over the distribution layer or package substrate. In some embodiments, the interior portion comprises one or more conductive features, such as vias or trenches, which may physically contact a surface of the IC chip. In some further embodiments, the peripheral portion comprises one or more conductive features, such as vias or trenches, which may physically contact a surface of the package redistribution layers or package substrate. Interior and peripheral portions of the conductive layers embedded within the mold compound may be electrically coupled together by one or more metal traces that pass over the mold compound.

FIG. 1 is a top-down plan view of an IC in an over-molded package assembly 101, in accordance with some embodiments. Over-molded package assembly 101 includes at least one IC chip 105 and/or discrete device (not depicted) embedded in a molding compound 110. IC chip 105 may be of any architecture and operable for any function(s), such as, but not limited to, a memory IC, a logic IC, a power IC, or a system-on-chip (SOC). A logic IC in this context may be a microprocessor, for example a central processor, a graphics processor, or a field programmable gate array. IC chip 105 may also be a photonic, electromagnetic (e.g., buck-boost power supply, etc.), or MEMS device (e.g., with magnetically or capacitively coupled released members, etc.). Examples of discrete devices include capacitors, inductors, or resistors. Molding compound 110 may be any material known to be suitable for over-molded IC packages, such as, but not limited to, an epoxy resin (e.g., an acrylate of novolac).

Figure 2:
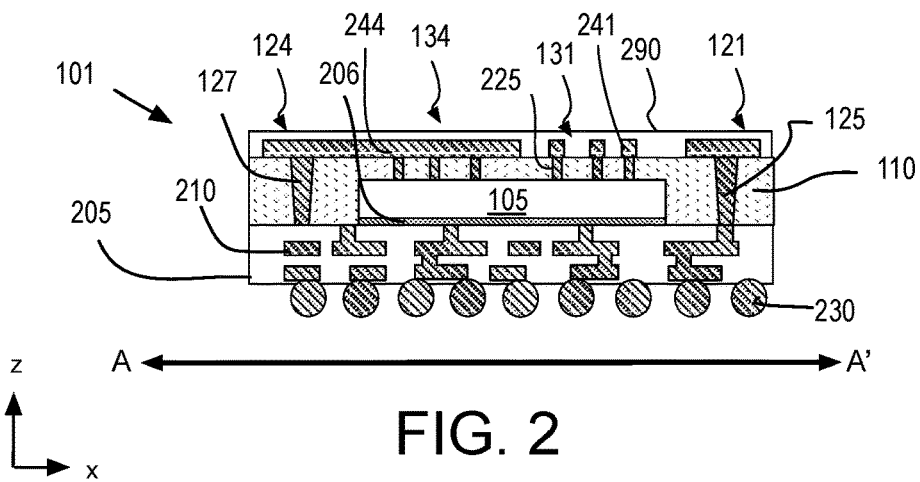
FIG. 2 is a cross-sectional view of the over-molded package assembly shown in FIG. 1, in accordance with some embodiments.

FIG. 2 is a cross-sectional view of over-molded package assembly 101, in accordance with some embodiments. The sectional view shown in FIG. 2 is along the dashed A-A' line denoted in FIG. 1. As shown in FIG. 2, over-molded package assembly 101 includes one or more metal redistribution layers 210 electrically coupled to a first side of IC chip 105. In the illustrated example, the first side of IC chip 105 includes circuitry 206 that faces metal redistribution layers 210. Molding compound 110 encapsulates a second side of IC chip 105 (e.g., the back side) and forms a perimeter surrounding the sidewall edges of IC chip 105. IC chip 105 may have any thickness, with an exemplary thickness range being 50-300 μm. At the periphery of IC chip 105, molding compound 110 has a thickness at least equal to that of IC chip 105 (e.g., 50-300 μm). Molding compound 110 has a non-zero thickness over IC chip 105. In the illustrated example where the surface of molding compound 110 is substantially planar (e.g., the molding compound surface has a z-dimensional height relative to the plane of redistribution layers 210 that is substantially the same between the peripheral region and over chip 105), the molding compound thickness over IC chip 105 is less than the molding compound thickness at the chip periphery.

Metal redistribution layers 210 may be embedded in any suitable build-up dielectric material 205, such as but not limited to, organic dielectric dry-laminate films. As shown, metal redistribution layers 210 are electrically interconnected to circuitry 206 with a bumpless technology. Metal redistribution layers 210 may be any metal, such as, but not limited to copper (Cu), and alloys thereof. At least at the periphery of IC chip 105, molding compound 110 makes contact with metal redistribution layers 210 and/or build-up dielectric material 205. Metal redistribution layers 210 are electrically interconnected to ball grid array (BGA) 230, which may comprise solder balls of any suitable alloy, such as, but not limited to, a Sn—Ag—Cu (SAC) alloy (e.g., "SAC 305" or "SAC 405"). BGA 230 is then to electrically couple over-molded package assembly 101 to a host board or substrate (not depicted).

In some embodiments, an over-molded IC package assembly includes one or more conductive vias or trenches passing through a thickness of the molding compound. Over-molded IC package assembly 101 includes metallized vias 125, 126 and a metallized trench 127. As shown in FIG. 1, metallized vias 125, 126 have a footprint that is approximately square or round and may be characterized with one critical dimension (e.g., diameter). Metallized trench 127 has a footprint associated with a width dimension that is smaller than a length dimension. In the example shown, metallized trench 127 continuously surrounds a corner of IC 105 with a first length extending in the y-dimension and a second length extending in the x-dimension). Alternative architectures where metallized trench 127 is bifurcated into two or more separate trenches are also possible.

As further shown in FIG. 2, metallized via 125, as well as metallized trench 127, extend through the entire thickness of molding compound 110 and are located within a peripheral portion of molding compound 110 that extends over redistribution metallization layers 210 beyond an edge of IC chip 105. In some embodiments, one or more such "through-mold" vias or trenches make direct contact to a conductive surface of metal redistribution layers 210. For such embodiments, a metallized via or trench may be directly coupled through conductive contact to a reference voltage (e.g., power or ground) conveyed by the particular one(s) of the redistribution metallization layers 210 that the via or trench is contacting. As tied to the reference voltage, the conductive through-mold via or trench may be operative as one or more of an electromagnetic interference (EMI) shield (e.g., to the IC chip 105 and/or signal routed within the redistribution metallization layers 210) or a signal current return path. When operative as a signal current return path, the architectures described herein may offer reduced loop inductance relative to alternative architectures designed to convey signals exclusively on redistribution metallization layers 210.

In some embodiments, one or more "through-mold" metallized vias or trenches make contact with a non-conductive surface of build-up dielectric material 205. For such embodiments, the via or trench may be only indirectly (e.g. capacitively and/or inductively) coupled to a signal and/or reference voltage plane (e.g., power or ground) conveyed by the particular one(s) of the redistribution metallization layers 210 with which the via or trench is in close proximity.

In one exemplary embodiment, a through-mold metallized via or trench is operable as a component of an electrical transmission line to convey signals within package assembly 101. In one such embodiment, metallized via 125 or metallized trench 127 is one conductor of a stripline electrical signal transmission line where via 125 or metallized trench 127 is maintained at a reference potential (e.g., ground) through a conductive connection to a particular one of the redistribution metallization layers 210. In some exemplary embodiments, redistribution metallization layer 210 may comprise the second conductor (e.g., signal), and the third conductor (e.g., ground) of the stripline. In another electrical transmission line embodiment, metallized via 125 or metallized trench 127 is one conductor of a microstrip transmission line that is maintained at a reference potential (e.g., ground). In some exemplary embodiments redistribution metallization layer 210 may comprise the second conductor (e.g., signal) of the microstrip.

In some embodiments, two or more metallized through-mold vias or trenches are electrically coupled together by a continuous metal sheet disposed over a molding compound surrounding an IC chip. In the example illustrated in FIG. 1 and FIG. 2, a metal sheet 121 provides electrical continuity between metallized via 125 and metallized via 126. In this example, metal sheet 121 is located only over the peripheral region of molding compound 110, extending continuously along two orthogonal sides of IC chip 105, adjacent to intersecting edges of IC chip 105. Opposite ends of metal sheet 121 terminate at the intersection of metallized via 125 and at the intersection of metallized via 126. As shown in FIG. 2, metal sheet 121 has a lateral dimension (e.g., x-dimension) that exceeds that of vias 125, 126 and extends over molding compound 110. Metal sheet 121 may have any thickness (e.g., z-dimension in FIG. 2), but in some examples is 10-20 μm as measured from the top surface of molding compound 110. Metal sheet 121 may be of any suitable composition. In some exemplary embodiments, metal sheet 121 has the same composition as through-mold metallized via 125 (e.g., Cu or an alloy thereof). Metal sheet 121 may, for example, be operative as a return path for signal current that is passed through one or more of redistribution metallization layers 210.

In some embodiments, a plurality of discontinuous metal sheets coupled to different metallized through-mold vias or trenches are maintained at different reference voltages. In the example illustrated in FIG. 1, metal sheet 121 is separate from metal sheet 122. Metal sheet 121 may therefore be biased during the operation of IC chip 105 to a first reference voltage (e.g., ground or $V_{ss}$) while metal sheet 122 may be concurrently biased to a second reference voltage (e.g., power or $V_{cc}$). Likewise, metal sheet 123 is discrete from adjacent metal sheets 122 and 124. Metal sheet 123 may therefore be biased to either of the first or second reference voltages, or to any arbitrary third reference voltage. Metal sheet 124 is also discrete from adjacent metal sheets 121 and 123. Metal sheet 124 may therefore be biased to any of the reference voltages of the other sheets 121-123, or to any arbitrary fourth reference voltage.

In some embodiments, one or more metallized via or trench is located within the interior portion of the molding compound that extends over the encapsulated IC chip. In some such embodiments, such "interior vias" extend through the thickness of the molding compound and make contact with a surface of the IC chip. In some embodiments where the IC chip includes routing metallization only on one side of the IC chip, metallized through-mold vias within the interior portion of the molding compound may land on a back-side of the IC chip, opposite the IC metallization. For such embodiments, the interior through-mold metallized vias may provide EMI shielding to the chip semiconductor and/or serve as a heat spreader. In some alternative embodiments, where the IC chip includes routing metallization on both sides of the IC chip, metallized through-mold vias within the interior portion of the molding compound may land on a metallized surface of the IC chip that may be further coupled to routing metallization on a front side of the IC by through-chip vias, for example.

FIGS. 1 and 2 illustrate an exemplary embodiment where metallized vias or trenches within an interior portion of molding compound 110 are employed to form a metal mesh 131 and 134, each of which may by operative as a heat spreader, conducting heat away from various points on IC chip 105. As shown in FIG. 2, the metal mesh includes a plurality of metallized trenches 225 arranged into a 1D array (e.g., a grating) having lengths extending in the y-dimension, widths in the x-dimension, and associated with some pitch in the x-dimension. In some embodiments, metallized trenches 225 are filled with the same conductive material as metallized vias or trenches located in the periphery (e.g., metallized vias 125, 126, or metallized trench 127). Metallized trenches 225 may be filled with any suitable metal, such as a Cu alloy, for example. The pitch and dimensions of metallized trenches 225 may vary, for example based on thermal modeling of the system to optimize the heat spreading function. Metal mesh 131, further includes metal traces 241 that intersect metallized trenches 225. As shown in FIG. 1, metal traces 241 are also arranged into a 1D array (e.g., a grating), but have lengths extending in the x-dimension, widths in the y-dimension, and associated with some pitch in the y-dimension. In some embodiments, metal traces 241 are of the same conductive material as metallized trenches 225 (e.g., a Cu alloy) and metal traces 241 are in contact with metallized trenches 225 so that mesh 131 has electrical and thermal continuity. Metal traces 241 may also run parallel to one or more metallized trenches 225, for example as shown in FIG. 2 where metal traces 241 are aligned over metallized trenches 225 to form a stacked trace and metallized trench having greater total z-height, which may be advantageous for heat spreading and/or dissipation. Hence, metal traces 241 may form a 2D fixed or variable grid of any desired pitch.

In some embodiments, a conductive via embedded in an interior portion of a molding compound is in contact with a conductive via embedded in a peripheral portion of the molding compound. Such contact may provide advantageous shielding of the IC chip. In some embodiments, interior and peripheral conductive vias/trenches intersect. Alternatively, an overlying metal trace may make a lateral run between the interior and peripheral regions. During operation of the packaged IC chip, the interior conductive vias may thereby become biased to the voltage of the peripheral conductive via, for example to a reference voltage (power, ground, etc.). In the example shown in FIG. 1, metal mesh 131 has one metal trace 241 that intersects metal sheet 121. Metal mesh 131 may therefore be biased to the reference voltage of metal sheet 121.

In some embodiments, a plurality of through-mold metallized vias or trenches within an interior portion of a molding compound are in contact with a separate metallized vias or trenches embedded in a peripheral portion of the molding compound. Various ones of the interior vias or trenches may therefore be maintained at different reference voltages. In the example illustrated in FIG. 1, each one of metal sheets 121, 122, 123 and 124 is in contact with a single one of metal meshes 131, 132, 133 and 134, respectively. Each metal mesh 131-134 may therefore be biased to the voltage of the corresponding metal sheet 121-124. As such, electrical shielding and/or heat spreading may occur within each quadrant of IC chip 105 while metal sheets 121-124 may be employed as separate reference voltage planes and/or electrical transmission line components.

In some embodiments, an over-molded IC package may include one or more protective layers over metal sheets, metal traces, and/or other metal features formed on and/or in a molding compound. In FIG. 2, for example, IC package assembly 101 includes a protective layer 290 encapsulating metal sheets 121, 124 and metal meshes 131, 134. Protective layer 290 may be any dielectric material, such as, but not limited to an organic dry-laminate film, a thermal conductive film or solder resist (e.g., SU-8 resist, etc.).

Figure 3:
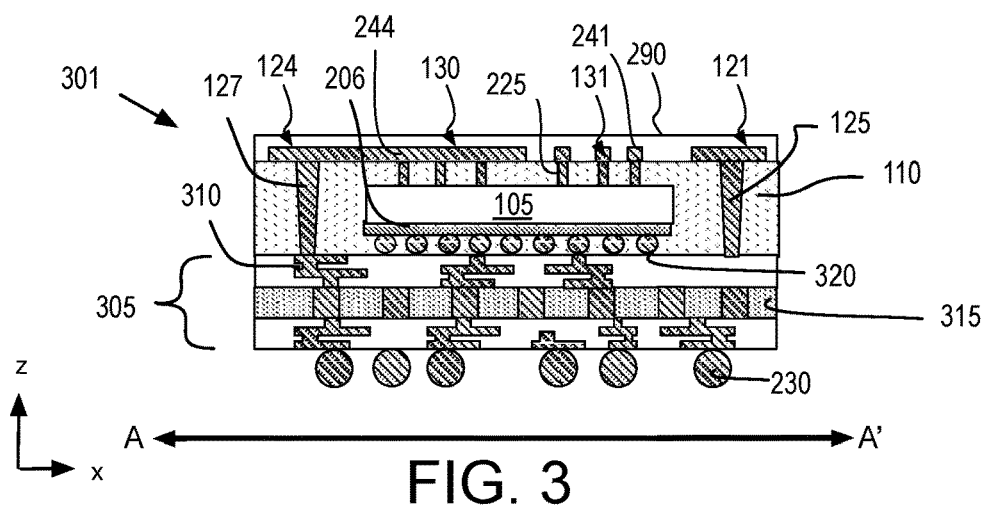
FIG. 3 is a cross-sectional view of an IC in an over-molded package assembly, in accordance with some alternative embodiments.

Notably, the packaging architectures described herein are also applicable to chip-scale packages having a discrete package substrate. FIG. 3 is a cross-sectional view of IC chip 105 in an over-molded package assembly 301, in accordance with some alternative embodiments. The sectional view shown in FIG. 3 is also along the dashed A-A' line denoted in FIG. 1 as the structures visible in FIG. 1 are applicable to both FIG. 2 and FIG. 3. Over-molded package assembly 301 includes a package substrate 305. Package substrate 305 may be any substrate known to be suitable for one or more of flip-chip packages (FCBGA), package-on-package (PoP), system-in-package (SiP), or the like. In some embodiments, package substrate 305 comprises a laminate of electrical routing metallization 310 embedded within dielectric build-up layers deposited on one or more sides of a core 315 (e.g., FR-5 glass and epoxy or bismaleimide-triazine resin). A first side of IC chip 105 that includes circuitry 206 may be attached, for example with any flip-chip technique, to substrate 305. IC chip 105 may be electrically interconnected to package substrate 305 by solder features 320 (e.g., microbumps, posts, etc.), wire bonds, lead frames, or any other suitable packaging interconnect architecture. Package substrate 305 may then be coupled to a host substrate (not depicted) through solder BGA 230.

Figure 4:
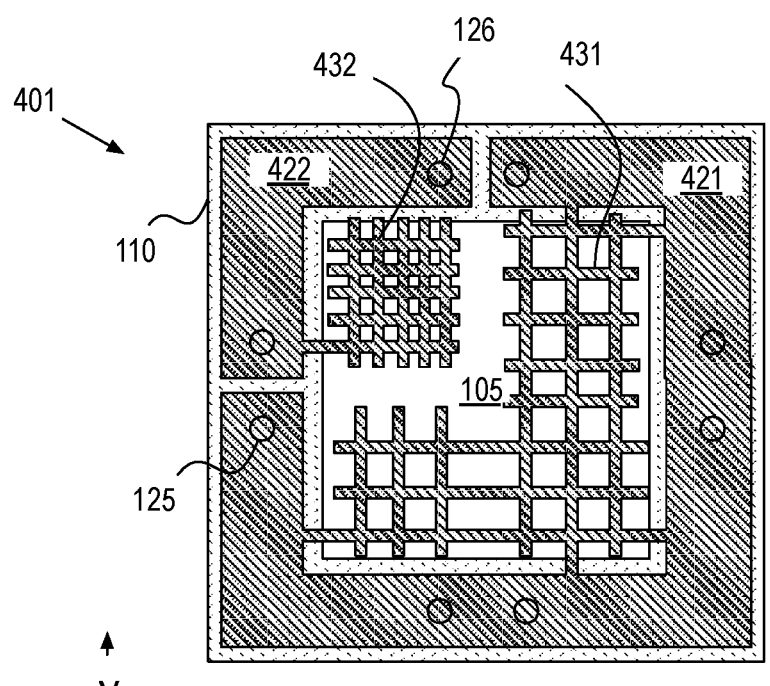
FIG. 4 is a top-down plan view of an IC in an over-molded package assembly, in accordance with some embodiments.

Through-mold conductive vias or trenches may be coupled to any number of reference voltage planes. Although metal sheets 121-124 in FIG. 1-3 illustrate four discrete peripheral metal sheets and four discrete interior metal meshes, other combinations are possible. For example, one continuous metal sheet surrounding an IC chip may be coupled to a single voltage plane. As another example, one continuous metal sheet may both surround an IC chip and extend over the IC chip. FIG. 4 is a top-down plan view of IC chip 105 in an over-molded package assembly 401, in accordance with another alternative embodiment that includes a first metal sheet 421 coupled to a first reference voltage (e.g., ground or $V_{ss}$) through one or more vias 125, and a second metal sheet 422 coupled to a second reference voltage (e.g., power or $V_{cc}$) through one or more metallized vias 126. Over-molded package assembly 401 also illustrates how conductive vias within the interior portion of molding compound 110 may be varied to accommodate a given thermal profile across IC chip 105. In the example shown, metal mesh 431 includes intersecting metallized trenches and metal traces having a first feature dimension or pitch, while metal mesh 432 includes intersecting metallized trenches and metal traces having a second, smaller, feature dimension, or denser pitch.

Figure 5:
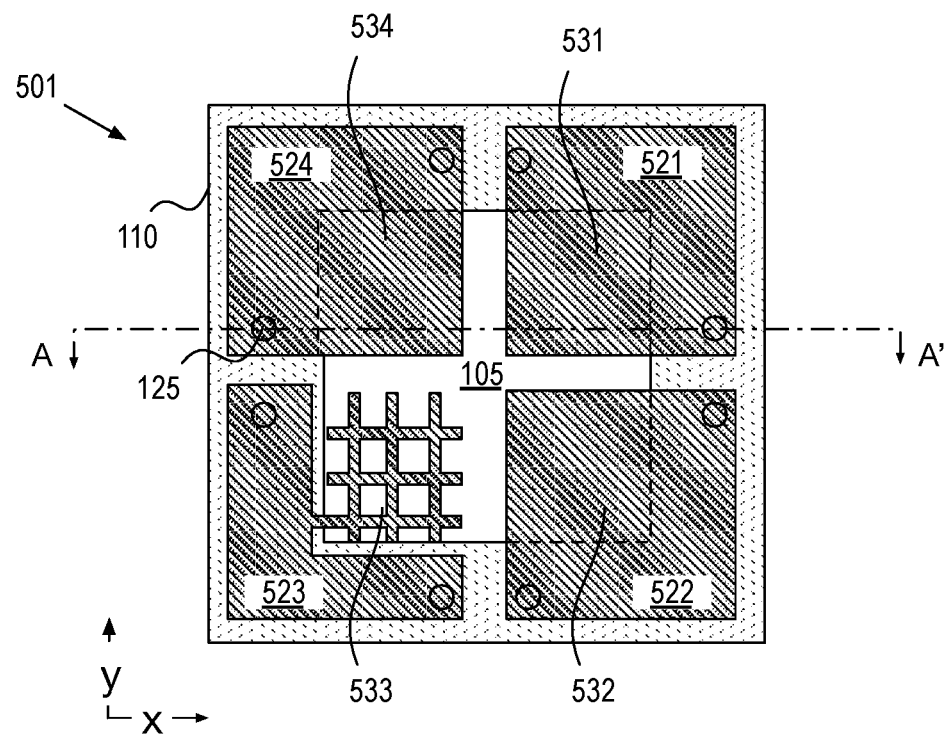
FIG. 5 is a top-down plan view of an IC in an over-molded package assembly, in accordance with some embodiments.

In some embodiments, metallized vias and/or trenches formed within an interior portion of a molding compound are arranged in other than an interconnected mesh or grid. For example, metallized trenches may be arrayed in a 1D grating pattern with each metallized trench contacting a metal feature (e.g., sheet) in the peripheral portion of the molding compound. Electrically conductive layers over a top surface of the molding compound may also be in the form of one or more continuous sheets, each of which may be coupled to a reference voltage. For example, FIG. 5 is a top-down plan view of IC chip 105 in an over-molded package assembly 501, in accordance with some embodiments. As shown by dashed line, the perimeter of IC chip 105 demarks peripheral and interior portions of molding compound 110. Continuous metal sheets 521, 522, 523 and 524 are coupled to at least a reference voltage (e.g., $V_{cc}$ and/or $V_{ss}$) by through-mold conductive vias 125. Continuous metal sheets 521, 522 and 524 extend over quadrants 531, 532 and 534 of IC chip 105. Metal sheet 523 is separately coupled to mesh 533, for example having the architecture substantially as described elsewhere herein, and therefore is operable to provide a second reference voltage plane.

Figure 6:
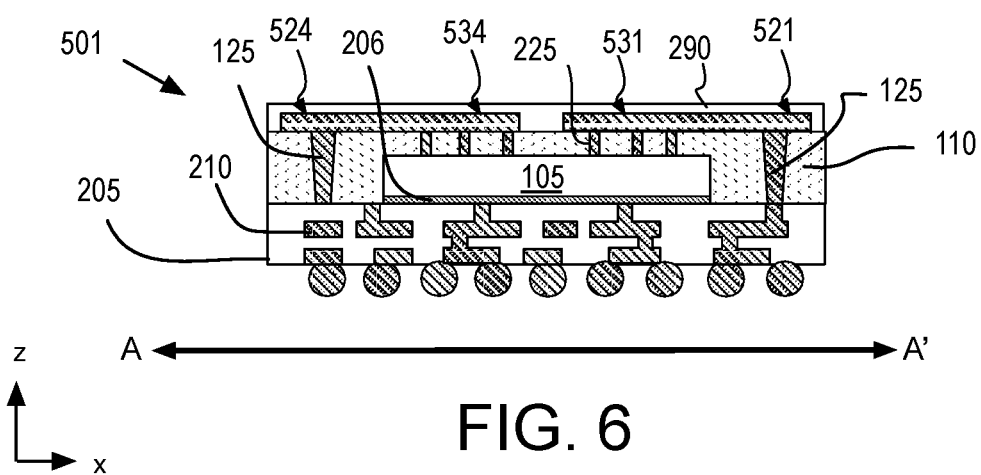
FIG. 6 is a cross-sectional view of the over-molded package assembly shown in FIG. 5, in accordance with some embodiments.

FIG. 6 is a cross-sectional view of the over-molded package assembly 501 along the A-A' line illustrated in FIG. 5, in accordance with some embodiments. As shown, metallized vias or trenches 225 contact IC chip 105 within quadrants 531 and 534, substantially as described elsewhere herein. Metal sheets 521 and 524 contact both conductive vias (trenches) within the interior portion of molding compound 110 and metallized vias 125 within the peripheral portion of molding compound 110.

Figure 7:
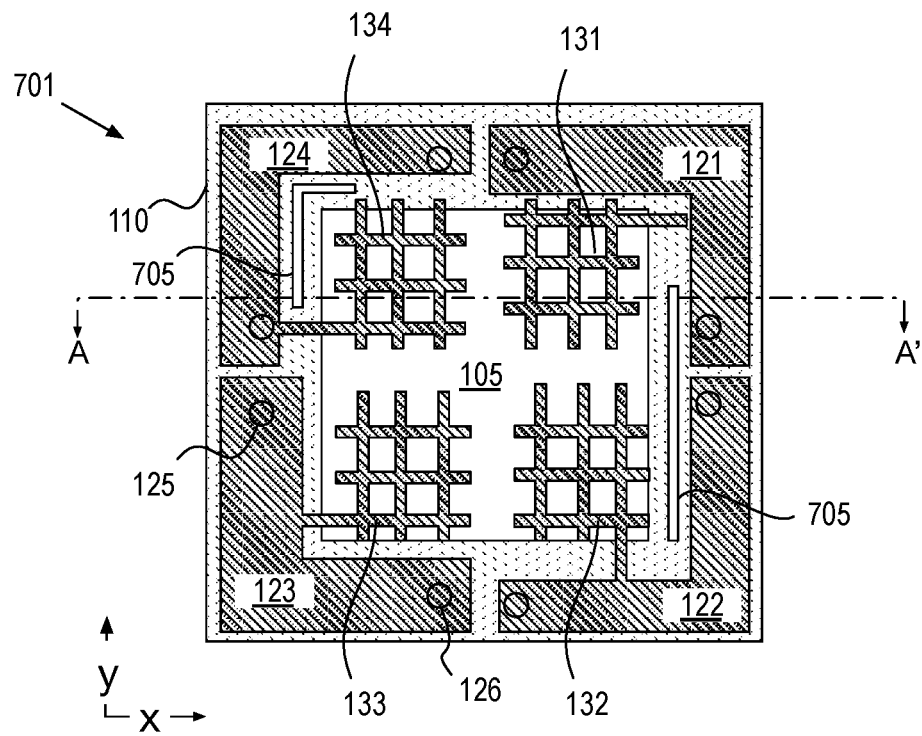
FIG. 7 is a top-down plan view of an IC in an over-molded package assembly, in accordance with some embodiments.
Figure 8:
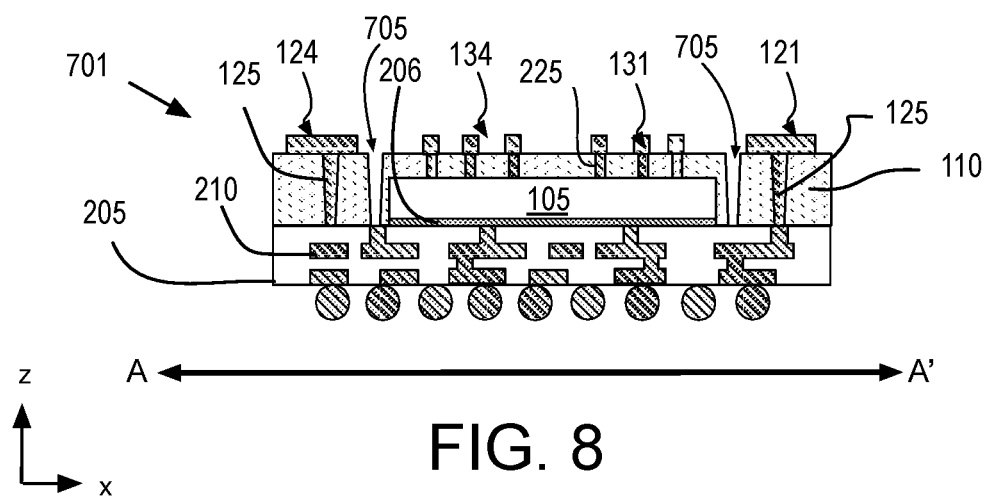
FIG. 8 is a cross-sectional view of the over-molded package assembly shown in FIG. 7, in accordance with some embodiments.

In some embodiments, an over-molded IC package assembly includes one or more open via or trench. Such unmetallized through-mold vias or trenches may be formed in the peripheral portion or interior portion of a molding compound and may facilitate degassing (e.g., of moisture) from the IC package assembly. FIG. 7 is a top-down plan view of IC chip 105 in an over-molded package 701, in accordance with some embodiments. FIG. 8 is a cross-sectional view of the over-molded package assembly 701 along the A-A' line denoted in FIG. 7, in accordance with some embodiments. As shown in FIG. 7, an unmetallized through mold trench 705 is located in a peripheral portion of molding compound 110, adjacent one or more edges of IC chip 105. The footprint of metal sheet 124 is reduced relative to that of metal sheet 121 to accommodate the footprint of unmetallized through-mold trench 705. In further reference to FIG. 8, unmetallized through-mold trench 705 is located between metallized via 125 and IC chip 105. Unmetallized through-mold trench 705 may land on a conductive surface or redistribution metallization layers 210, or on a non-conductive surface of build-up dielectric material 205. Unmetallized through mold vias and/or trenches may have any shape and dimensions. Lateral dimensions of unmetallized through-mold vias or trenches may for example be substantially equal to a metallized via or trench. In some embodiments, minimum lateral dimensions of unmetallized through-mold vias or trenches range from 5-50 µm.

Figure 9:
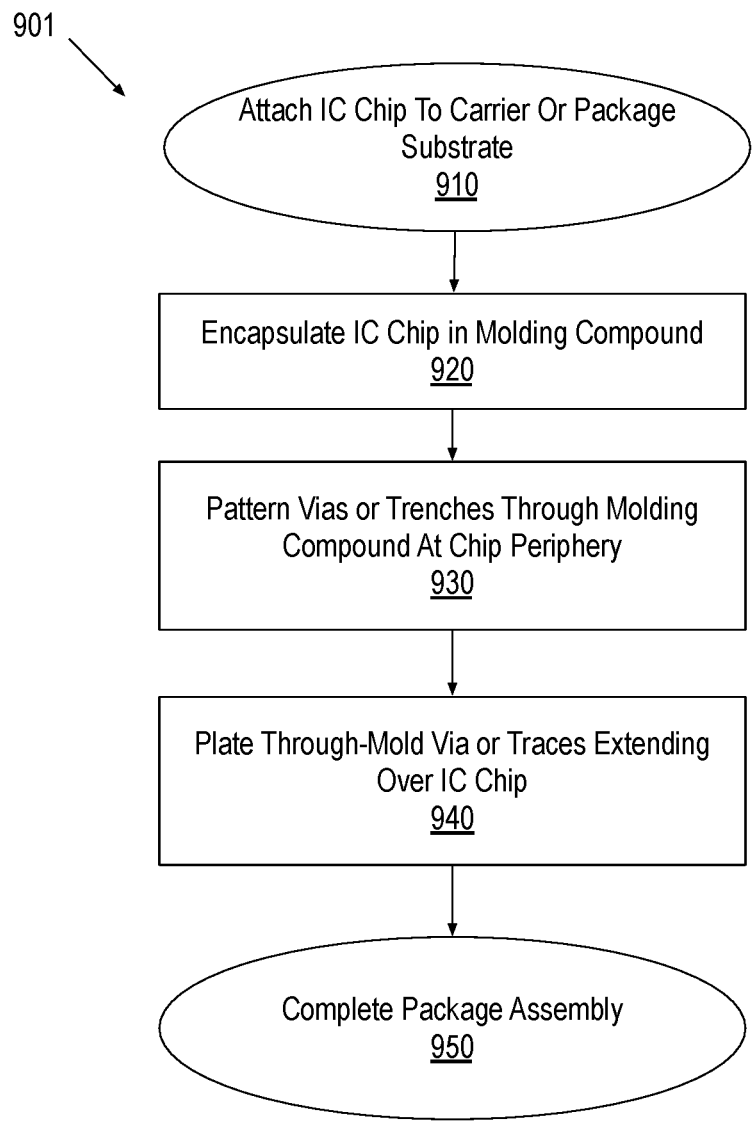
FIG. 9 is a flow diagram illustrating methods of fabricating an IC in an over-molded package assembly, in accordance with some embodiments.

The package assemblies described above may be fabricated using a variety of methods. FIG. 9 is a flow diagram illustrating some exemplary methods 901 for fabricating an IC in an over-molded package, in accordance with some embodiments. FIGS. 10A, 10B, 10C, 10D, 10E, 10F and 10G are cross-sectional views of an IC in an over-molded package evolving as selected operations of the methods 901 are performed, in accordance with some illustrative embodiments.

Figure 10A:
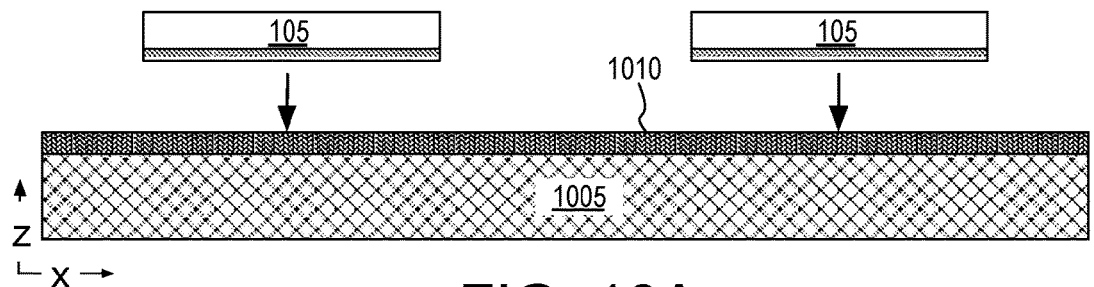
FIGS. 10A, 10B, 10C, 10D, 10E, 10F and 10G are cross-sectional views of an IC in an over-molded package assembly evolving as selected operations of the method in FIG. 9 are performed, in accordance with some embodiments.

Referring first to FIG. 9, methods 901 begin at operation 910 where IC chips are attached to a carrier or a package substrate. Singulated, known-good chips may be mounted upon the carrier package substrate to reconstitute a wafer, for example with any suitable pick-and-place technique. IC chips may be affixed to a carrier, for example with an adhesive, or by any other means known to be suitable for preparing an over-molding substrate. FIG. 10A further illustrates IC chips 105 being reconstituted onto a carrier 1005 and affixed by an adhesive 1010, for example. In this example, IC chip 105 is flipped to have the circuitry-side facing adhesive 1010. Alternatively, an IC chip may be affixed to a package substrate, for example with any flip-chip process.

Figure 10B:
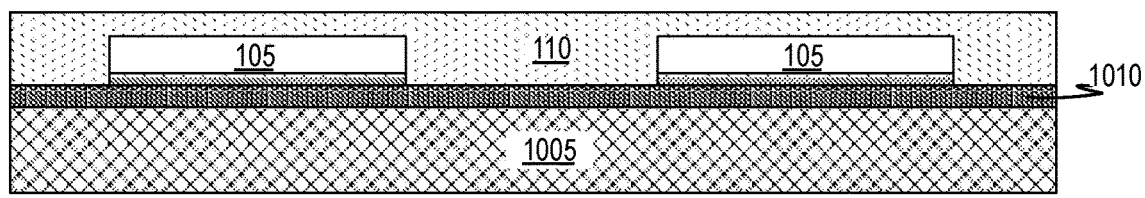

Returning to FIG. 9, methods 901 continue at operation 920 where the IC chips attached to the carrier are encapsulated in molding compound. Any over-molding process may be employed, such as, but not limited to an injection molding process, and/or a compression molding process, and/or a transfer molding process. Following the molding process, the IC chips are individually encapsulated in the molding compound. FIG. 10B further illustrates IC chips 105 encapsulated within molding compound 110.

Figure 10C:
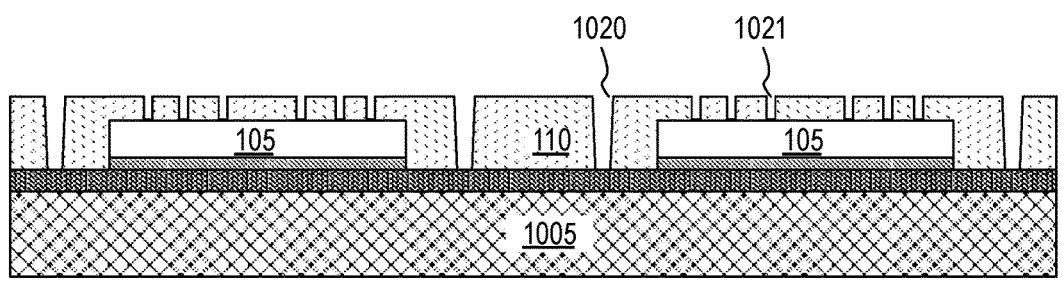

Returning to FIG. 9, methods 901 continue at operation 930 where vias and/or trenches are patterned into at least the peripheral portion of the molding compound. Depending on the molding compound composition, operation 930 may include one or more of UV exposure, or laser ablation, for example. Laser ablation may be with any pico-second or femto-second laser. Etching/ablation times may be selected to form through-mold vias or trenches that expose the underlying carrier or package substrate. FIG. 10C further illustrates through-mold vias/trenches 1020 formed with a peripheral portion of molding compound 110 and through-mold vias/trenches 1021 formed with an interior portion of molding compound 110. Vias/trenches 1020 and 1021 may be formed concurrently (e.g., with multi-beam laser source) or scanned serially. Beams with different spot sizes may be employed where vias/trenches 1020 are to be of a different lateral dimension than vias/trenches 1021. Alternatively, a source of a single beam size is employed to form both vias/trenches 1020 and 1021 with variation in lateral dimensions being a result of extending ablation time for the deeper vias in the periphery.

Figure 10D:
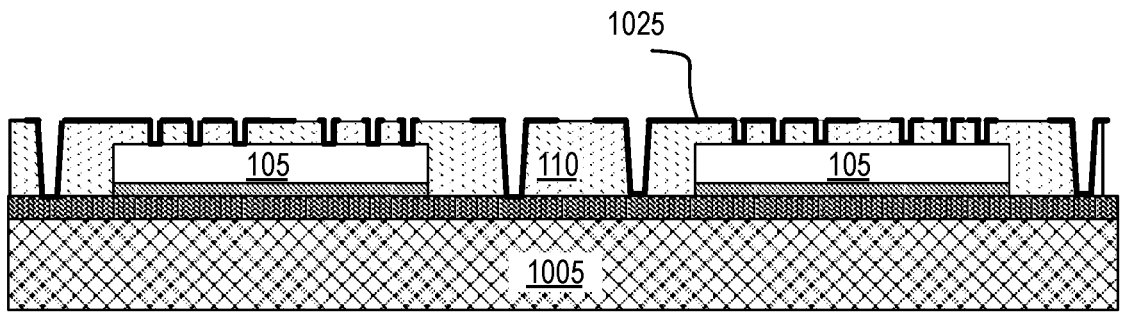
Figure 10E:
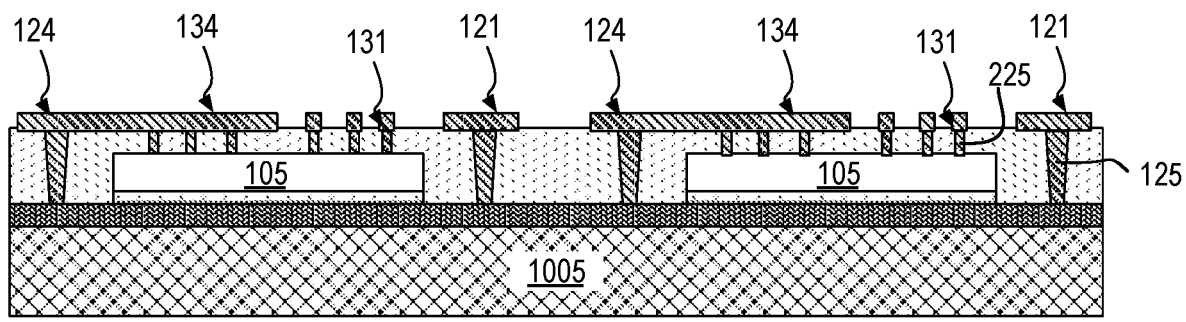

Returning to FIG. 9, methods 901 continue at operation 940 where the through-mold vias or trenches are at least partially backfilled with a conductive material. In the exemplary embodiment, metal is plated into the through-mold vias or trenches. Metal is also selectively plated over a top surface of the mold compound to laterally coupled two or more of the conductive vias. Any electroless or electrolytic plating process may be employed at operation 940, for example to backfill the vias or trenches with Cu or a Cu alloy. FIG. 10D further illustrates deposition and patterning of a conductive seed layer 1025. Seed layer 1025 may be any suitable metal, for example. Patterning may be by any suitable technique, such as, but not limited to lithographic mask patterning, (contact or projection printing) and etch of the unmasked seed layer portion. With the seed layer patterned, any suitable selective plating process may be performed to selectively deposit metal onto the patterned seed layer. FIG. 10E further illustrates the backfilling of vias to form metallized through-mold vias 125, trenches 225, metal sheets 121, 124 and metal meshes 131, 134. Following the metal deposition, via or trench patterning operation 930 may be repeated to form additional through-mold vias or trenches that are to remain unmetallized, for example to facilitate package assembly outgassing.

Figure 10F:
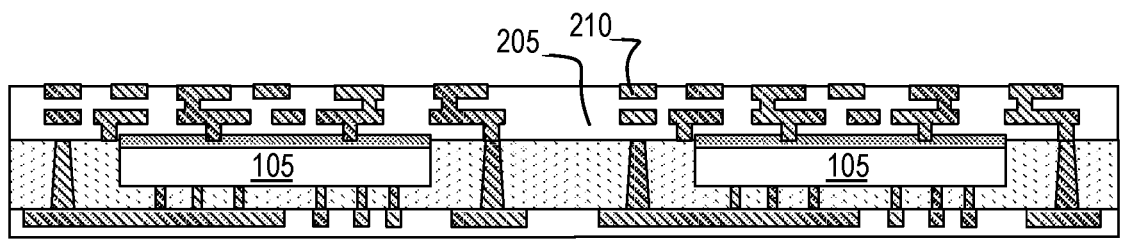
Figure 10G:
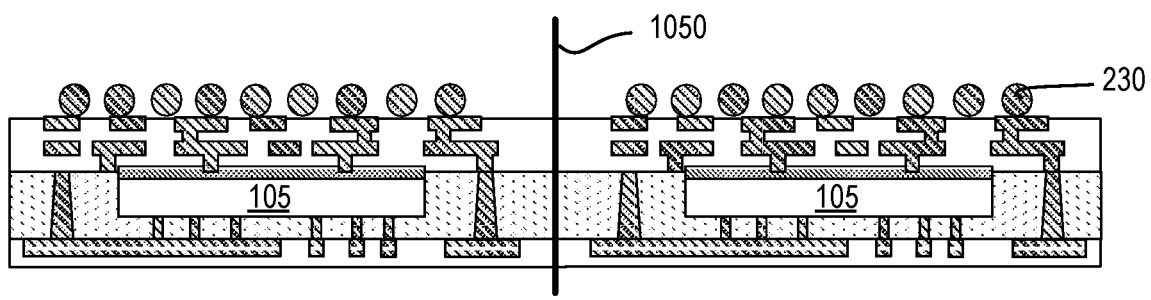

Returning to FIG. 9, methods 901 continue at operation 950 where the package assembly is completed. A carrier employed in the over-mold operation(s)may be removed at operation 950, for example, and any suitable techniques may be employed to build up metallization levels on a surface of the IC chips exposed upon removal of the carrier. FIG. 10F further illustrates removal of carrier 1005 are build up of dielectric 205 and redistribution metallization layers 210. Any dielectric lamination, electroplating, and/or etching processes known to be suitable to form such structures may be employed. FIG. 10G further illustrates the attachment of solder balls 230 on a metal finish of the build-up layers, for example by any suitable surface mounting or solder reflow process. Similar techniques may be employed to attach solder balls on a metal finish of a package substrate. Package assemblies are then singulated with any suitable singulation process 1050, such as, but not limited to mechanical sawing, scribing, or laser ablation processes. Each singulated package has one or more of the features described elsewhere herein.

Figure 11:
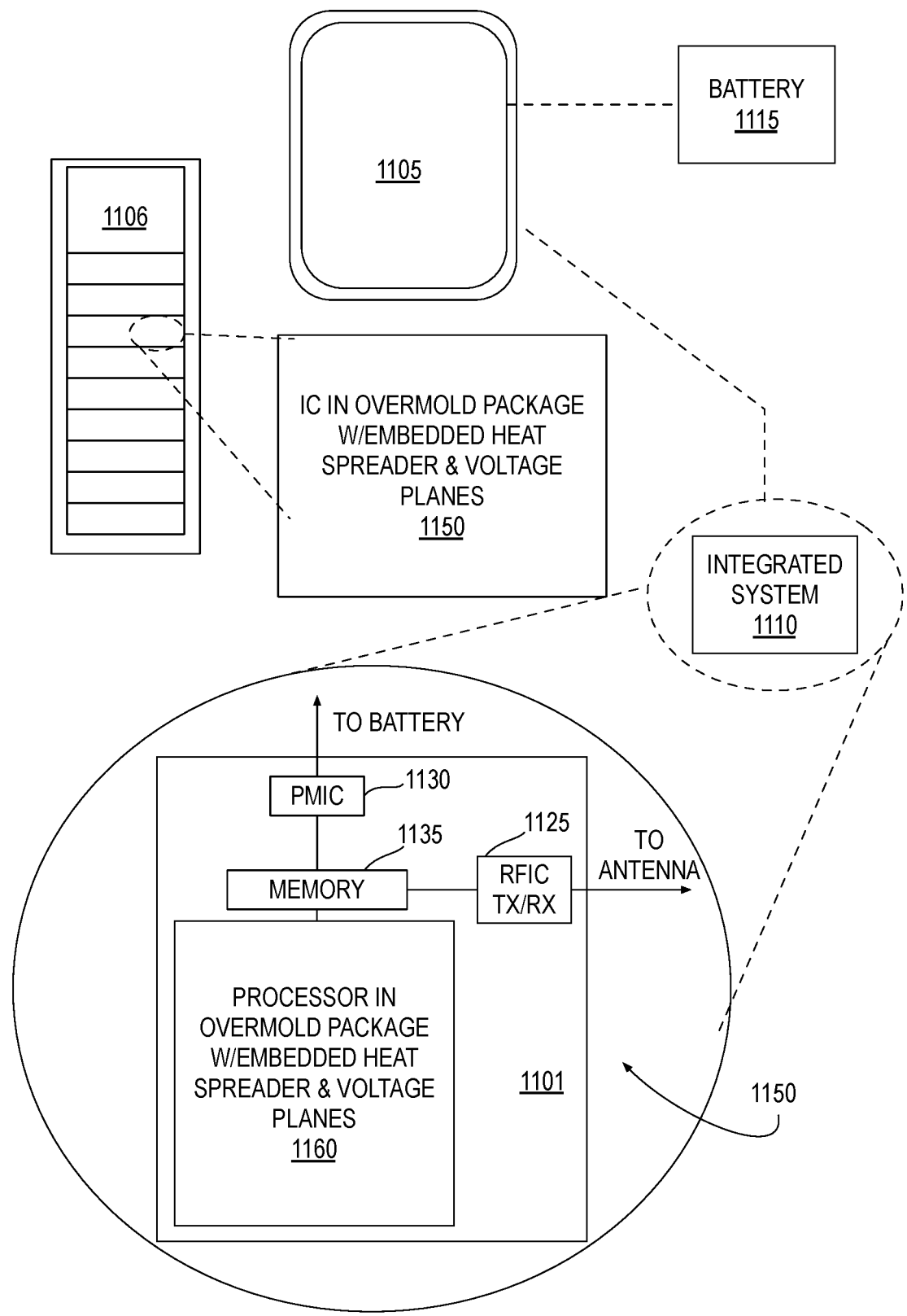
FIG. 11 illustrates a mobile computing platform and a data server machine employing an IC with an over-molded package assembly, in accordance with some embodiments.

FIG. 11 illustrates a mobile computing platform and a data server machine employing an IC chip contained within an over-molded IC package with an embedded reference voltage plane or heater spreader, for example as described elsewhere herein. The server machine 1106 may be any commercial server, for example including any number of high-performance computing platforms disposed within a rack and networked together for electronic data processing, which in the exemplary embodiment includes a packaged monolithic SoC 1150. The mobile computing platform 1105 may be any portable device configured for each of electronic data display, electronic data processing, wireless electronic data transmission, or the like. For example, the mobile computing platform 1105 may be any of a tablet, a smart phone, laptop computer, etc., and may include a display screen (e.g., a capacitive, inductive, resistive, or optical touchscreen), a chip-level or package-level integrated system 1110, and a battery 1115.

As a system component within the server machine 1106, SoC 1150 may include a memory block (e.g., RAM) and a processor block 1160 (e.g., a microprocessor, a multi-core microprocessor, graphics processor, or the like) contained within an over-molded IC package with an embedded reference voltage plane or heater spreader, for example as described elsewhere herein. SoC 1150 includes a substrate to which one or more of a power management integrated circuit (PMIC) 1130, RF (wireless) integrated circuit (RFIC) 1125 including a wideband RF (wireless) transmitter and/or receiver (TX/RX), and memory 1135 are interconnected to a substrate 1101 through BGA solder connections.

Functionally, PMIC 1130 may perform battery power regulation, DC-to-DC conversion, etc., and so has an input coupled to battery 1115 and with an output providing a current supply to other functional modules. As further illustrated, in the exemplary embodiment, RFIC 1125 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs or integrated into monolithic SoC 1150.

Figure 12:
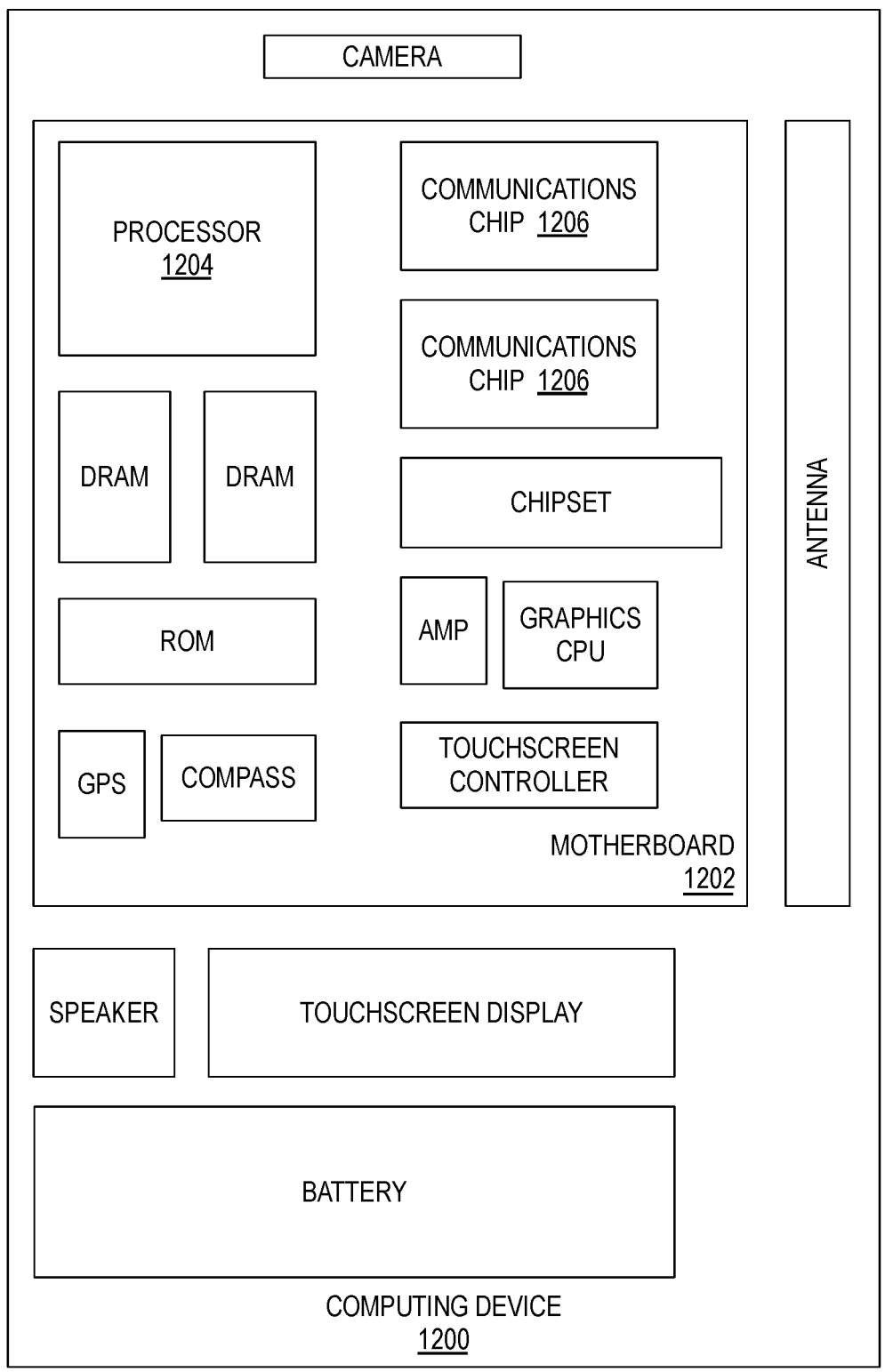
FIG. 12 is a functional block diagram of an electronic computing device, in accordance with some embodiments.

FIG. 12 is a functional block diagram of an electronic computing device, in accordance with some embodiments. Computing device 1200 may be found inside platform 1105 or server machine 1106, for example. Device 1200 further includes a motherboard 1202 hosting a number of components, such as, but not limited to, a processor 1204 (e.g., an applications processor), which may be contained within an over-molded IC package with an embedded reference voltage plane or heater spreader, for example as described elsewhere herein. Processor 1204 may be physically and/or electrically coupled to motherboard 1202. In some examples, processor 1204 includes an integrated circuit die, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1206 may also be physically and/or electrically coupled to the motherboard 1202. In further implementations, communication chips 1206 may be part of processor 1204. Depending on its applications, computing device 1200 may include other components that may or may not be physically and electrically coupled to motherboard 1202. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1206 may enable wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although they might not. Communication chips 1206 may implement any of a number of wireless standards or protocols, including but not limited to those described elsewhere herein. As discussed, computing device 1200 may include a plurality of communication chips 1206. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example the above embodiments may include specific combinations of features as further provided below.

In one or more first examples, a microelectronic device package assembly, comprising an integrated circuit (IC) chip and a molding compound surrounding the IC chip. An interior portion of the molding compound is located over the IC chip, and a peripheral portion of the molding compound extends beyond edges of the IC chip. One or more first metallized vias or trenches pass through a thickness of the peripheral portion of the molding compound. One or more second metallized vias or trenches pass through a thickness of the interior portion of the molding compound and are electrically connected to the one or more first metallized vias or trenches by one or more metal traces extending over the molding compound.

In one or more second examples, for any of the first examples the assembly further comprises one or more metal redistribution layers or a package substrate coupled to the IC chip. The peripheral portion of the molding compound is located over the metal redistribution layers or package substrate. The first metallized vias or trenches contact a surface of the metal redistribution layers or the package substrate. Continuous metal sheet occupies a first area over the peripheral portion of the molding compound and is coupled to the first metallized vias or trenches.

In one or more third examples, for any of the first and second examples further the package assembly comprises a metal mesh including one or more metal traces coupled to the metal sheet and occupying a second area over the interior portion of the molding compound.

In one or more fourth examples, for any of third examples the metal mesh comprises two or more metallized trenches passing through a thickness of the molding compound over the IC chip and extending in a first direction and two or more metal traces extending over the molding compound and the IC chip in a second direction intersecting the two or more metallized trenches.

In one or more fifth examples, for any of fourth examples at least one of the metallized trenches or metal traces makes contact with a surface of the IC chip.

In one or more sixth examples, for any of the second examples the metal sheet and metal mesh are coupled to a reference voltage supplied by the metal redistribution layers or package substrate.

In one or more sixth examples, for any of the second examples the metal sheet is one of a plurality of metal sheets, each coupled to one or more metallized vias or trenches and occupying discrete area over the peripheral portion of the molding compound.

In one or more eighth examples, for any of the seventh examples each of the plurality of metal sheets is coupled to a separate one of a plurality of metal meshes, individual ones of the metal meshes occupying a discrete areas over the interior portion of the molding compound.

In one or more ninth examples, for any of the eighth examples the plurality of metal sheets is coupled to different reference voltages supplied by the metal redistribution layers or package substrate.

In one or more tenth examples, for any of the ninth examples the plurality of metal sheets comprise four metal sheets occupying four corners over the peripheral portion of the molding compound and the reference voltages include at least a power reference voltage ($V_{cc}$) and/or a ground reference voltage ($V_{ss}$).

In one or more eleventh examples, for any of the eighth examples the plurality of metal meshes has different mesh densities with a first metal mesh having a metallized trench pitch exceeding that of a second metallized trench pitch.

In one or more twelfth examples, for any of the first through eleventh examples the first metallized vias or trenches comprise a trench having a length exceeding a majority of a length of the metal sheet.

In one or more thirteenth examples, for any of the first through twelfth examples the package assembly further comprises an encapsulant layer over the first and second metallized vias or trenches, the encapsulant layer have a composition different than the molding compound.

In one or more fourteenth examples, for any of the first through thirteenth examples the package assembly one or more degas vias or trenches extending through the molding compound and located between the first and second metallized vias or trenches, the degas trenches substantially free of metal.

In one or more fifteenth examples, a microelectronic device comprises a microprocessor, a memory, and a battery. At least the microprocessor is embedded within an interior portion of a molding compound. One or more first metallized vias or trenches pass through a thickness of a peripheral portion of the molding compound and contacts a metal distribution layer or a package substrate. A continuous metal sheet is coupled to the first metallized vias or trenches and occupies a first area over the peripheral portion of the molding compound. A metal mesh is coupled to the metal sheet, the metal mesh comprising one or more second metallized vias or trenches passing through a thickness of the interior portion of the molding compound and contacting the metal sheet.

In one or more sixteenth examples, for any of the fifteenth examples the metal mesh comprises metallized trenches passing through a thickness of the molding compound over the IC chip and extending in a first direction, and metal traces passing extending over the molding compound in a second direction and intersecting the metallized trenches. At least one of the first and second metallized vias or trenches makes contact with a surface of the IC chip. The metal sheet and metal mesh are coupled to a reference voltage supplied by the metal redistribution layers or package substrate.

In one or more seventeenth examples, a method of fabricating a microelectronic package assembly comprises encapsulating the IC chip in a molding compound, patterning first vias or trenches through a peripheral portion of the molding compound located beyond edges of the IC chip, patterning second vias or trenches through an interior portion of the molding compound located over the IC chip, filling the first and second vias or trenches with a metal, and forming one or more metal traces over the mold compound. Individual ones of the metal traces couple one or more of the metallized vias or trenches in the peripheral portion of the molding compound to one or more of the metallized vias or trenches in the interior portion of the molding compound.

In one or more eighteenth examples, for any of the seventeenth examples the method includes patterning the first and second vias or trenches further comprises laser ablating features into the molding compound. Filling the vias or trenches and forming the one or more metal traces further comprises depositing a conductive seed layer, patterning the seed layer, and plating the metal selectively onto the seed layer.

In one or more nineteenth examples, for any of the seventeenth through eighteenth examples the method comprises building up one or more metal redistribution layers over a front-side of the IC chip and over a surface of the molding compound, at least one of the metal redistribution layers contacting one or more of the metallized vias or trenches.

In one or more twentieth examples, for any of the seventeenth through nineteenth examples the method include flip-chip attaching a front-side of the IC chip, opposite the molding compound, to a package substrate prior to encapsulating the IC chip in the molding compound, wherein one or more of the metallized vias or trenches contacts a metal land on the package substrate.

In one or more twenty-first examples, for any of the seventeenth through twentieth examples the method includes patterning third vias or trenches through the peripheral portion of the molding compound after filling the first and second vias or trenches with the metal.

In one ore more twenty-second example, for any of the seventeenth through twenty-first examples the method further includes depositing a dielectric protection layer over the metal traces.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A microelectronic device package assembly, comprising:
   a package substrate or one or more metal redistribution layers;
   an integrated circuit (IC) chip including circuitry on a first side of the IC chip facing the package substrate or the metal redistribution layers, the circuitry coupled to the package substrate or the metal redistribution layers;
   a package material surrounding the IC chip, wherein an interior portion of the package material is located over a second side of the IC chip, opposite the first side, and wherein a peripheral portion of the package material extends beyond an edge of the IC chip and over the package substrate or the metal redistribution layers;
   one or more first metal-filled vias or trenches passing through a thickness of the peripheral portion of the package material, the first metal-filled vias or trenches in contact with the package substrate or at least one of the metal redistribution layers;
   one or more second metal-filled via or trenches passing through a thickness of the interior portion of the package material, in contact with the second side of the IC chip, and electrically connected to the one or more first metal-filled vias or trenches by one or more first metal traces extending between the interior portion and the peripheral portion of the package material.

2. The package assembly of claim 1, further comprising:
a metal sheet in a first area over the peripheral portion of the package material and coupled to the first metal-filled vias or trenches.

3. The package assembly of claim 2, further comprising a metal mesh within a second area over the interior portion of the package material, the metal mesh coupled to the metal sheet.

4. The package assembly of claim 3, wherein the metal mesh comprises:
two or more of the second metal-filled trenches extending in a first direction; and
two or more second metal traces extending in a second direction intersecting the two or more metal-filled trenches.

5. The package assembly of claim 4, wherein the metal sheet is coupled to a reference voltage supplied through the package substrate or the metal redistribution layers.

6. The package assembly of claim 3, wherein the metal sheet and the metal mesh are coupled to a same reference voltage supplied through the metal redistribution layers or the package substrate, wherein the reference voltage comprises at least one of a power voltage or a ground voltage supplied to the IC chip.

7. The package assembly of claim 2, wherein the metal sheet is one of a plurality of metal sheets, each of the metal sheets coupled to one or more of the first metal-filled vias or trenches, and each of the metal sheets occupying a discrete area over the peripheral portion of the package material.

8. The package assembly of claim 7, wherein each of the plurality of metal sheets is coupled to a separate one of a plurality of metal meshes, individual ones of the metal meshes occupying a discrete area over the interior portion of the package material.

9. The package assembly of claim 8, wherein individual ones of the plurality of metal sheets are coupled to different reference voltages supplied through the metal redistribution layers or package substrate.

10. The package assembly of claim 9, wherein the plurality of metal sheets comprises four metal sheets occupying four corners of the peripheral portion of the package material, and the reference voltages include at least a power reference voltage or a ground reference voltage.

11. The package assembly of claim 8, wherein a first of the plurality of metal meshes has a pitch exceeding that of a second of the plurality of metal meshes.

12. The package assembly of claim 1, further comprising an encapsulant layer over the first and second metal-filled vias or trenches, the encapsulant layer having a composition different than the package material.

13. The package assembly of claim 1, further comprising one or more open vias or trenches extending through the package material and located between the first and second metal-filled vias or trenches, the open vias or trenches substantially free of metal.

14. A microelectronic device, comprising:
a microprocessor chip;
a memory chip; and
a battery, wherein:
at least the microprocessor chip is embedded within an interior portion of a package material, the microprocessor chip comprising circuitry on a first side of the microprocessor chip facing a package substrate or a metal distribution layer;
one or more first metal-filled vias or trenches pass through a thickness of a peripheral portion of the package material adjacent to an edge of the microprocessor chip, and a contact the metal distribution layer or a package substrate;
one or more second metal-filled vias or trenches pass through a thickness of an interior portion of the package material over the microprocessor chip, and contact a second side of the microprocessor chip, opposite the first side; and
the second metal-filled vias or trenches are electrically connected to the first metal-filled vias or trenches by one or more metal traces extending between the interior portion and the peripheral portion of the package material.

15. The device of claim 14, wherein:
a metal mesh comprises:
a pair of the second metal-filled trenches extending in a first direction; and
a pair of metal traces extending in a second direction and intersecting the pair of second metal-filled trenches;
and
the metal mesh is coupled to a reference voltage supplied through the first metal-filled vias or trenches, and through the metal redistribution layers or package substrate.

* * * * *